United States Patent
Ma et al.

(10) Patent No.: US 12,328,853 B2
(45) Date of Patent: Jun. 10, 2025

(54) POWER SUPPLY DEVICE AND PRINTED CIRCUIT BOARD DEVICE COMPRISING SAME

(71) Applicant: Telefonaktiebolaget LM Ericsson (publ), Stockholm (SE)

(72) Inventors: Tai Ma, Beijing (CN); Chao Wen, Beijing (CN)

(73) Assignee: Telefonaktiebolaget LM Ericsson (Publ), Stockholm (SE)

(*) Notice: Subject to any disclaimer, the term of this patent is extended or adjusted under 35 U.S.C. 154(b) by 1083 days.

(21) Appl. No.: 17/056,067

(22) PCT Filed: May 18, 2018

(86) PCT No.: PCT/CN2018/087486
§ 371 (c)(1),
(2) Date: Jul. 2, 2021

(87) PCT Pub. No.: WO2019/218344
PCT Pub. Date: Nov. 21, 2019

(65) Prior Publication Data
US 2021/0321527 A1 Oct. 14, 2021

(51) Int. Cl.
*H05K 7/20* (2006.01)
*H02M 3/00* (2006.01)
(Continued)

(52) U.S. Cl.
CPC ............ *H05K 7/209* (2013.01); *H02M 3/003* (2021.05); *H05K 1/0209* (2013.01); *H05K 1/181* (2013.01);
(Continued)

(58) Field of Classification Search
CPC ............ H01L 23/053; H01L 2924/181; H02M 3/003; H02M 7/003; H05K 1/18;
(Continued)

(56) References Cited

U.S. PATENT DOCUMENTS 6,982,876 B1  1/2006  Young
8,547,699 B1  10/2013  McCleary
(Continued)

FOREIGN PATENT DOCUMENTS

CN  103763852 A  4/2014
CN  103872036 A  6/2014
(Continued)

OTHER PUBLICATIONS

Search Report issued by the Chinese Patent Office for Application No. PCT/CN2018/087486—May 22, 2019.
(Continued)

*Primary Examiner* — Adam B Dravininkas
(74) *Attorney, Agent, or Firm* — Weisberg I.P. Law, P.A.

(57) ABSTRACT

A power supply device (20, 20', 20") and a printed circuit board device (100, 100', 100") including the same are provided in embodiments of the present disclosure. The power supply device (20, 20', 20") is mounted on a mainboard (10) and includes a first surface (11). The power supply device (20, 20', 20") includes: a magnetic device (22) located above the first surface (11) of the mainboard (10) and electrically connected to the mainboard (10); at least one accommodating portion (24) located on a surface of the magnetic device (22) facing towards the first surface (11); and a semiconductor device (26) which is at least partially accommodated in the at least one accommodating portion (24) and electrically connected to the mainboard (10).

14 Claims, 8 Drawing Sheets

(51) Int. Cl.
*H05K 1/02* (2006.01)
*H05K 1/18* (2006.01)

(52) U.S. Cl.
CPC ... *H05K 7/2039* (2013.01); *H05K 2201/1003* (2013.01)

(58) Field of Classification Search
CPC .... H05K 1/181; H05K 1/0206; H05K 1/0203; H05K 1/0209; H05K 7/2039; H05K 7/20454; H05K 7/209; H05K 2201/1003; H05K 2201/10371
See application file for complete search history.

(56) References Cited

U.S. PATENT DOCUMENTS

| | | | |
|---|---|---|---|
| 9,300,222 B2 | 3/2016 | Moss | |
| 2008/0101025 A1 | 5/2008 | Harris et al. | |
| 2009/0207574 A1* | 8/2009 | Chen | H01L 25/16 361/761 |
| 2011/0228507 A1* | 9/2011 | Yin | H05K 1/18 361/811 |
| 2012/0063038 A1* | 3/2012 | Yin | H05K 9/0007 361/18 |
| 2012/0098361 A1* | 4/2012 | Yamasaki | H02K 11/33 310/52 |
| 2012/0262145 A1* | 10/2012 | Chen | H05K 1/181 323/311 |
| 2013/0081266 A1* | 4/2013 | Xing | H05K 7/209 29/840 |
| 2014/0029324 A1* | 1/2014 | Sanae | H05K 7/209 363/141 |
| 2014/0346661 A1 | 11/2014 | Liu et al. | |
| 2015/0070850 A1* | 3/2015 | Moss | H01L 29/00 361/728 |
| 2019/0013736 A1* | 1/2019 | Hong | H02M 3/1582 |

FOREIGN PATENT DOCUMENTS

| | | |
|---|---|---|
| CN | 105449987 A | 3/2016 |
| CN | 107 768 350 A | 3/2018 |
| CN | 208369458 U | 1/2019 |

OTHER PUBLICATIONS

PCT International Preliminary Report On Patentability issued for International application No. PCT/CN2018/087486—Nov. 24, 2020.
Extended European Search Report issued for Application No. /Patent No. 18918824.6-1203 / 3731390 PCT/CN2018087486—Jun. 16, 2021.

* cited by examiner

Prior Art

POWER SUPPLY DEVICE AND PRINTED CIRCUIT BOARD DEVICE COMPRISING SAME

TECHNICAL FIELD

The present disclosure relates to the field of power electronics industry, and in particular, to a power supply device and a printed circuit board device including the same.

BACKGROUND

In the era of rapid developing electronic technology, power supply devices in electronic products, such as switching mode power supplies (SMPS), raise a limit to sizes of the electronic products to a certain extent, especially in case that small-sized electronic products are desired.

Typically, a switching mode power supply has three main components, i.e., a magnetic device, a switching component, and a control component. The magnetic device includes an inductor and a transformer; the switching component includes switching devices, such as diodes, MOSFETs, GaN FETs, IGBTs and the like. The control component includes an analog or digital controller and a peripheral circuit associated thereto.

Currently, there are two ways to reduce the size of the switching mode power supplies. One way is to increase switching frequency and the other way is to integrate all the components into one packaging piece. As for the case of the integration scheme, there are mainly two solutions.

Figure 7:
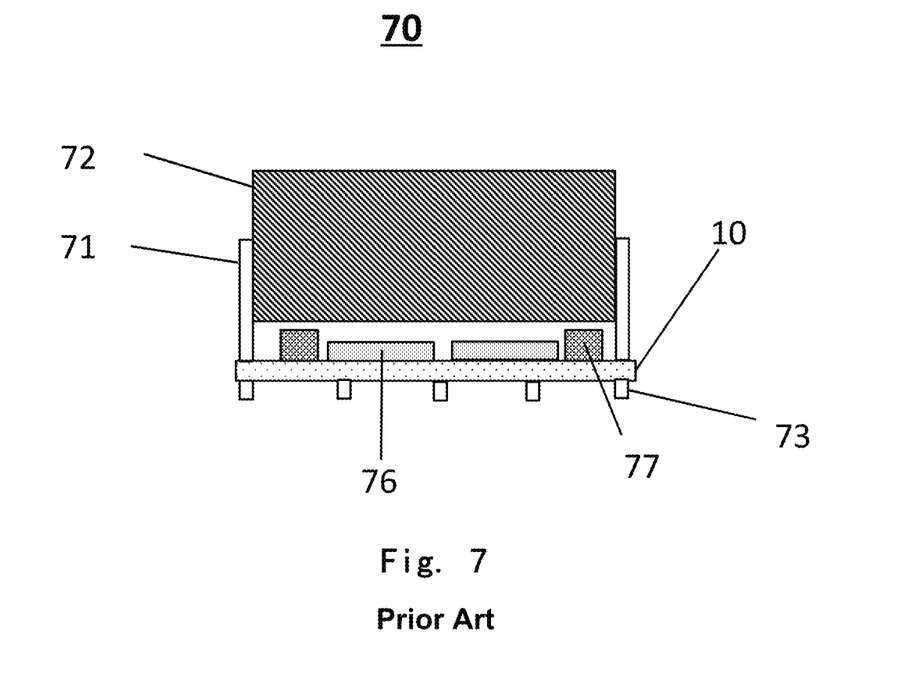
FIG. 7 is a schematic structural view of a power module scheme in the prior art.

One solution of the integration scheme refers to a power module 70 scheme as shown in FIG. 7. A plurality of switching components 76 and a plurality of control components 77 are firstly integrated on a circuit board or a mainboard 10, and then a magnetic component 72 is mounted above the switching components 76 and the control components 77, and disposed on and electrically connected to the mainboard 10 via pins 71. A plurality of pins 73 are disposed on a lower surface of the mainboard 10. Thus, heat generated by the switching components 76 needs to be removed by an air flow. That is, heat dissipation of the switching components is mainly dependent on an air flow speed. However, in a sealed environment or product, there is scarcely any air flow significantly around the power module 70. Therefore, in most cases, a path of the heat dissipation only depends on natural convection. This causes a problem of poor heat dissipation. In addition, since the magnetic component 72 is mounted above the switching components 76 and the control components 77, the size of the power module 70 is not sufficiently small.

Figure 8:
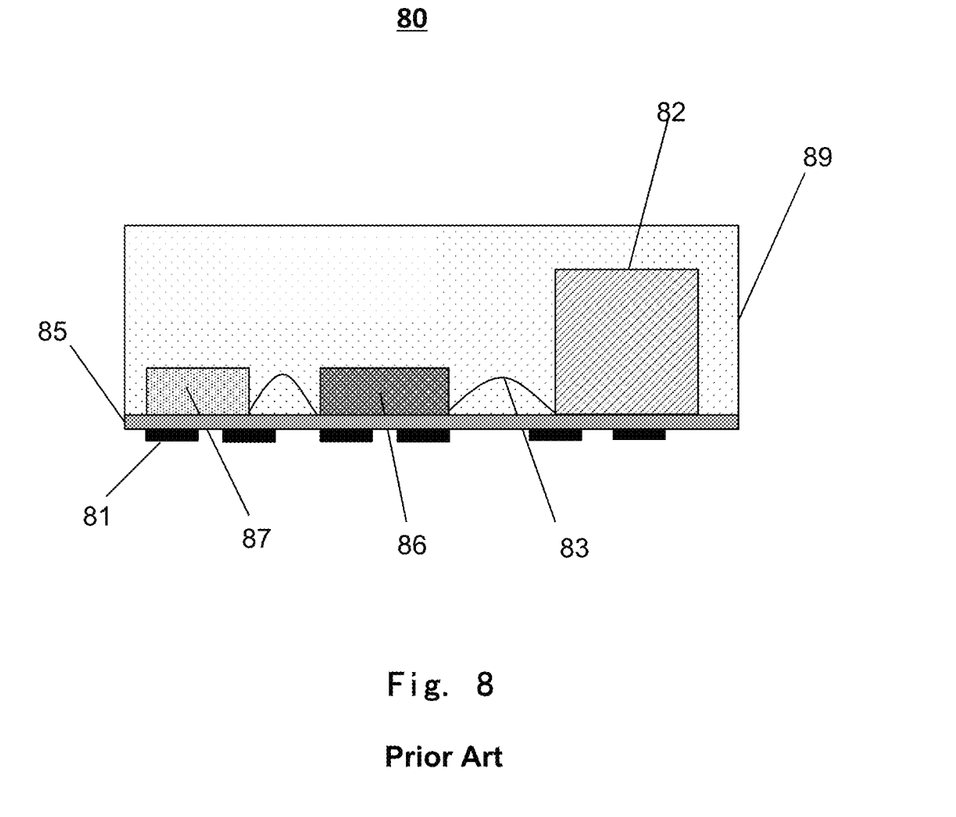
FIG. 8 is a schematic structural view of a chip package scheme in the prior art.

Another solution of the integration scheme refers to a sealed chip package scheme as shown in FIG. 8. The entire power module 80 includes: a substrate 85 made of metal (for example, copper), a switching component 86, a magnetic component 82 and a control board 87 spaced apart from each other on an upper surface of the substrate 85. The switching component 86, the magnetic component 82 and the control board 87 are electrically connected to each other by soldering leads 83, and then the entire upper surface of the substrate 81 is covered by a packaging piece 89. Soldering pins 81 are provided on a lower surface of the substrate 85. Specifically, the magnetic component 82, the switching component 86 and the control component 87 are connected by using the soldering leads 83 and the metal substrate 85. In this way, although the chip package scheme has a smaller size, it has a significantly higher cost than the power module scheme shown in FIG. 7. In particular, the sealed chip package scheme cannot be used for high voltage applications due to insulation or safety requirements.

SUMMARY

In view of the above, in order to at least partially address the above problems, embodiments of the present disclosure provide a power supply device and a printed circuit board device including the same, to at least partially reduce their sizes and/or improve their heat dissipation effect.

According to one aspect of the present disclosure, there is provided a power supply device mounted on a mainboard, wherein the mainboard comprises a first surface, wherein the power supply device comprises:

a magnetic device located above the first surface of the mainboard and electrically connected to the mainboard;

at least one accommodating portion located on a surface of the magnetic device facing towards the first surface; and a semiconductor device which is at least partially accommodated in the at least one accommodating portion and electrically connected to the mainboard.

In some embodiments, the semiconductor device and the magnetic device are only thermally coupled with each other.

In some embodiments, each of the at least one accommodating portion is a cavity which is recessed inwardly from the surface of the magnetic device facing towards the first surface.

In some embodiments, the power supply device further comprises a first thermally conductive portion located in the at least one accommodating portion, and the semiconductor device is thermally coupled with the magnetic device by the first thermally conductive portion.

In some embodiments, the magnetic device further comprises at least one first pin configured to be electrically connected to the mainboard, and the semiconductor device further comprises at least one second pin configured to be electrically connected to the mainboard.

In some embodiments, the magnetic device comprises an inductor and/or a transformer, and the semiconductor device comprises a semiconductor power circuit and/or a semiconductor control circuit.

In some embodiments, at least a portion of the semiconductor power circuit is accommodated in the at least one accommodating portion.

In some embodiments, the semiconductor power circuit and/or the semiconductor control circuit are/is integrated on a printed circuit board, and are/is at least partially accommodated in the at least one accommodating portion, and the printed circuit board is electrically connected to the mainboard.

In some embodiments, the semiconductor power circuit comprises one or more of diodes, MOSFETs, GaN FETs, and IGBTs, and the semiconductor control circuit comprises a control chip and a peripheral circuit associated thereto.

In accordance with another aspect of the present disclosure, it also provides a printed circuit board device, comprising:

a mainboard; and the power supply device as described above, cooperating with the mainboard.

In some embodiments, the printed circuit board device further comprises:

a heat sink located on a side of a second surface of the mainboard opposite to the first surface; and/or a cover which is located at a side of the first surface of the mainboard and configured to at least partially surround the mainboard and the magnetic device.

In some embodiments, the printed circuit board device further comprises:

a second thermally conductive portion located between the second surface and the heat sink; and/or a third thermally conductive portion located between the cover and a surface of the magnetic device facing away from the mainboard.

In some embodiments, the printed circuit board device further comprises:

a heat sink located above a surface of the magnetic device facing away from the mainboard; and/or a cover which is located at a side of a second surface of the mainboard and configured to at least partially surround the mainboard and the magnetic device.

In some embodiments, the printed circuit board device further comprises:

a second thermally conductive portion located between the cover and the second surface of the mainboard; and/or a third thermally conductive portion located between the surface of the magnetic device facing away from the mainboard and the heat sink.

In some embodiments, at least a portion of the cover is directly connected to the heat sink; and/or at least a portion of the cover and/or at least a portion of the heat sink are/is directly connected to a surface of the mainboard.

BRIEF DESCRIPTION OF THE DRAWINGS

In order to more clearly describe technical solutions of the embodiments of the present disclosure, the drawings involved in the embodiments will be briefly described below. It should be appreciated that the drawings described below refer only to some embodiments of the present disclosure, rather than limiting the present disclosure. In the drawings.

DETAILED DESCRIPTION OF EMBODIMENTS

In order to more clearly set forth objectives, technical solutions and advantages of the present disclosure, the embodiments of the present disclosure will be described in detail below with reference to the accompanying drawings. It is to be understood that the following description of the embodiments is intended to explain and clarify the general concepts of the present disclosure, but should not be interpreted as limiting the present disclosure. In the specification and the drawings, the same or similar reference numerals refer to the same or similar components or members. For the sake of clarity, the drawings are not necessarily drawn to scale, and some well-known components and structures may be omitted in the drawings.

Unless otherwise defined, technical terms or scientific terms used in the present disclosure should be understood in general sense by those skilled in the art. The words "first," "second," and the like used in the present disclosure do not denote any order, quantity, or importance, but are only used to distinguish different components. The word "a" "an" or "one" does not exclude a plurality of items. The words "comprise", "include", and the like, are intended to mean that the elements or items that appear in the front of such the words include the elements or items and equivalents thereof listed in the rear of such the words, but not exclude other elements or items. The words "connect", "couple" and the like are not limited to physical or mechanical connections, but may include electrical connections, regardless of direct or indirect connections. "Upper", "lower", "left", "right", "top", "bottom" and the like are only used to indicate relative positional relationships. If an absolute position of the object to be described is changed, the relative positional relationship may also be changed accordingly. If an element, such as a layer, a film, a region or a base substrate, is referred to as being "on" or "under" another element, the element may be "directly" "on" or "under" the another element, or there may be intermediate elements therebetween.

Figure 1A:
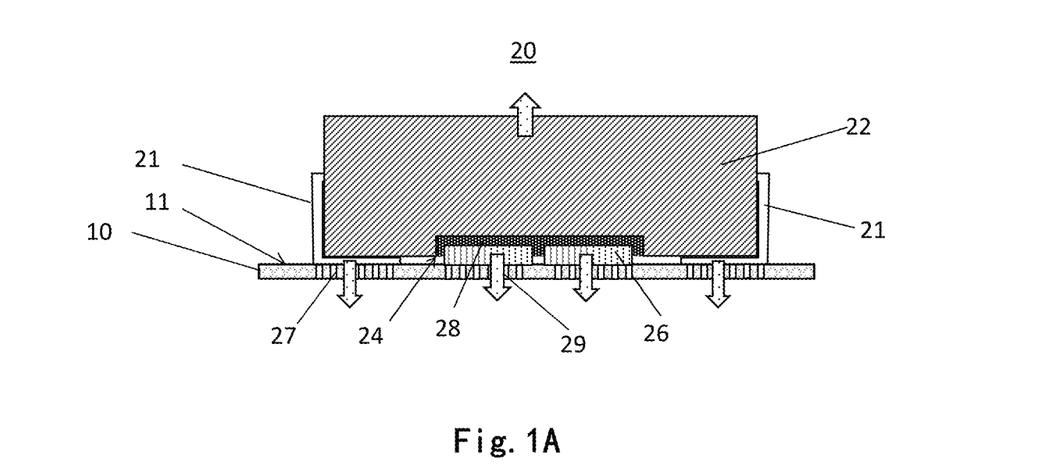
FIG. 1A is a schematic cross-sectional view of a power supply device mounted on a mainboard according to an embodiment of the present disclosure.
Figure 1B:
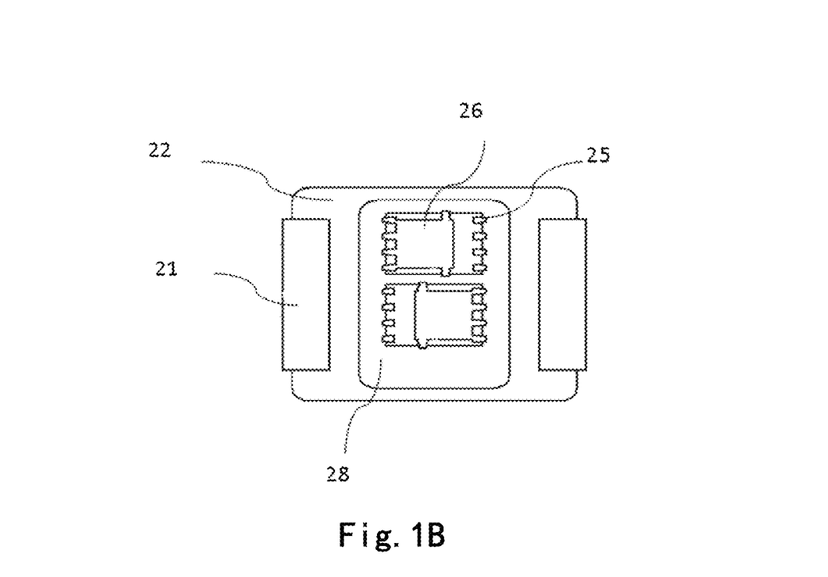
FIG. 1B is a bottom view of the power supply device shown in FIG. 1A with the mainboard being removed.

FIGS. 1A and FIG. 1B are respectively schematic structural views of a power supply device 20 mounted on a mainboard 10 and with the mainboard 10 being removed according to an embodiment of the present disclosure. The power supply device 20 is mounted on the mainboard 10, specifically on a first surface 11 of the mainboard 10.

The power supply device 20 includes three main components, i.e., a magnetic device 22, at least one accommodating portion 24, and a semiconductor device 26.

The magnetic device 22 is located above the first surface 11 of the mainboard 10, and it is electrically connected to the mainboard 10. The magnetic device 22 includes an inductor and/or a transformer.

The at least one accommodating portion 24 is located on a surface of the magnetic device 22 facing towards the first surface 11 (i.e., a bottom surface of the magnetic device 22). As will be described in detail below, the accommodating portion 24 may be for example a groove formed in the bottom surface of the magnetic device 22, or may be formed by for example a height or thickness of a pin of the magnetic device 22 which is inserted between the bottom surface of the magnetic device 22 and the mainboard 10. It should be noted that the number of the accommodating portions 24 is not limited to that shown in the drawings, and it may be selected and set by those skilled in the art as needed. In the present disclosure, only one accommodating portion 24 is shown for the purpose of simplifying the drawings.

The semiconductor device 26 is disposed in such a way that it is at least partially accommodated in the corresponding accommodating portion 24 and electrically connected to the mainboard 10. It should be noted herein that the semiconductor device 26 and the magnetic device 22 are only thermally coupled to each other, but they form an electrical connection with each other only through the mainboard. The thermal connection herein means that there is a path of heat dissipation between the semiconductor device 26 and the magnetic device 22.

In this embodiment, a size of the power supply device or a printed circuit board device is reduced because the semiconductor device is at least partially accommodated in the accommodating portion in the magnetic device, as compared with the structural configuration shown in FIG. 7.

In combination with what shown in FIG. 1B, the magnetic device 22 is soldered to corresponding positions on the mainboard 10 by for example first pins 21 on both sides thereof, to achieve an electrical connection with the mainboard 10. Similarly, the semiconductor device 26 is soldered to corresponding positions on the mainboard 10 by for example second pins 25 on both sides thereof, to achieve an electrical connection with the mainboard 10. The number, thickness, length, and the like of the first pins 21 and the second pins 25 may be selected and set as needed, without being limited to those as shown in the drawings.

As shown in FIG. 1A, the accommodating portion 24 may be a cavity which is recessed inwardly from the bottom surface of the magnetic device 22. That is, the accommodation portion 24 may be formed by providing a groove onto the bottom surface of the magnetic device 22.

Further, the power supply device 20 further includes a first thermally conductive portion 28 located in the accommodating portion 24, and the semiconductor device 26 is thermally coupled with the magnetic device 22 by the first thermally conductive portion 28. The first thermally conductive portion 28 may be selected to be formed from a thermally conductive medium which is made of a thermal interface material (for example, LOCTITE ABLESTIK G500 or LOCTITE 5404). It is also possible that the first thermally conductive portion 28 may be formed from any other suitable materials or in any other suitable manners.

In an example of the present disclosure, the mainboard 10 further includes: at least one first through hole 27 provided to correspond to the magnetic device 22; and/or at least one second through hole 29 provided to correspond to the semiconductor device 26. Specifically, the first through holes 27 are disposed at positions on the mainboard 10 corresponding to portions of the first pins 21 between the mainboard 10 and the magnetic device 22, and the second through holes 29 are disposed at positions on the mainboard 10 corresponding to portions of the second pins 25 between the mainboard 10 and the semiconductor device 26. By means of providing the first through holes 27 and/or the second through holes 29, the heat generated by the magnetic device 22 and the semiconductor device 26 may be transferred to surrounding environment outside the mainboard 10, thereby changing the heat dissipation of the power supply device 20.

In this case, the heat generated by the semiconductor device 26 can be dissipated to the surrounding environment under and outside the mainboard 10 through the mainboard 10 and/or the second through holes 29, and it can also be transferred to the magnetic device 22 through the first thermally conductive portion 28, and dissipated outwardly through the magnetic device 22, as indicated by arrows in the drawings. To some extent, the magnetic device 22 may function like a heat sink when the temperature of the semiconductor device 26 is relatively high.

That is, the semiconductor device 26 has two paths of heat dissipation (as indicated by arrows in the drawings). One path of heat dissipation refers to that the heat generated by the semiconductor device 26 is propagated upwardly to the magnetic device 22 through the first thermally conductive portion 28, and then it is dissipated to the surrounding environment through the magnetic device 22; the other path of heat dissipation refers to that the heat generated by the semiconductor device 26 is propagated downwardly and dissipated to the surrounding environment through the mainboard 10 and/or the second through holes 29 in the mainboard 10.

In addition, the heat generated by the magnetic device 22 can be directly outwardly dissipated to the surrounding environment, and it can also be dissipated to the surrounding environment under the mainboard 10 through the first pins 21, the mainboard 10 and/or the first through holes 27 in the mainboard 10. Of course, when the temperature of the magnetic device 22 is greater than the temperature of the semiconductor device 26, the semiconductor device 26 may also be used to assist the magnetic device 22 in dissipating heat. That is, since the magnetic device and the semiconductor device are directly connected to each other or connected to each other by the first thermally conductive portion 28, they may help each other to dissipate heat.

It should be noted that the semiconductor device 26 may include a semiconductor power circuit and/or a semiconductor control circuit. In one example, the semiconductor power circuit includes one or more of diodes, MOSFETs, GaN FETs, and IGBTs, and the semiconductor control circuit includes a control chip and a peripheral circuit associated thereto. In an embodiment of the present disclosure, at least a portion of the semiconductor power circuit is disposed in the accommodating portion 24, while the semiconductor control circuit may be disposed in the accommodating portion 24 or not be disposed in the accommodating portion, depending on actual needs. If the semiconductor control circuit is not accommodated in the accommodating portion 24, it may be soldered to any suitable position on the mainboard 10.

Figure 2A:
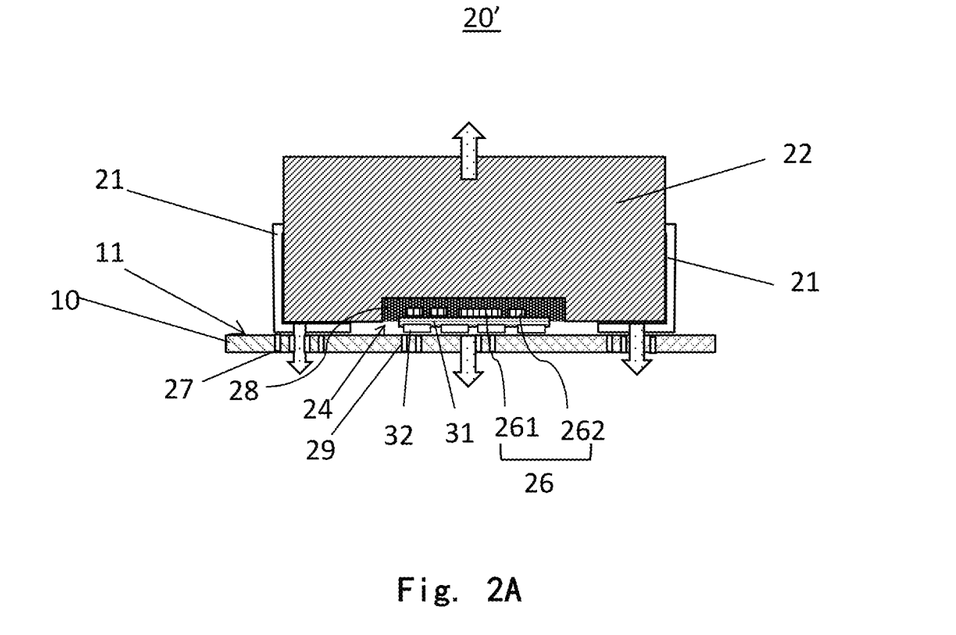
FIG. 2A is a schematic cross-sectional view of a power supply device mounted on a mainboard according to another embodiment of the present disclosure.
Figure 2B:
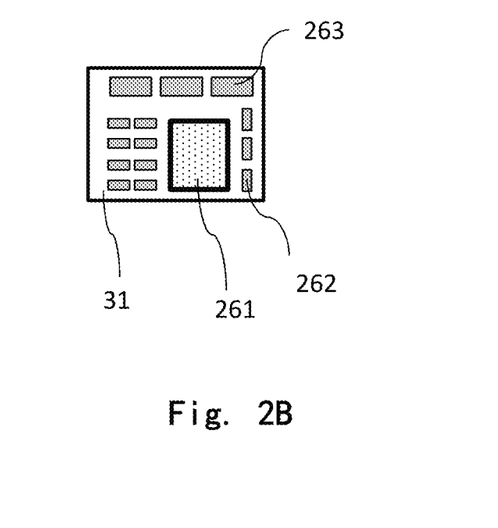
FIG. 2B is a top view showing a structure in which a semiconductor device shown in FIG. 2A is integrated on a circuit board.
Figure 2C:
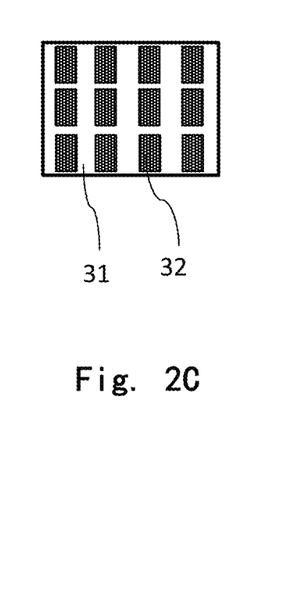
FIG. 2C is a bottom view showing a structure in which a semiconductor device shown in FIG. 2A is integrated on a circuit board.

Referring to FIGS. 2A, 2B and 2C, they are respectively a schematic cross-sectional view of a power supply device 20' mounted on a mainboard according to another embodiment of the present disclosure, a top view and a bottom view of a semiconductor device 26 integrated on a printed circuit board.

A majority of structural configurations of the power supply device 20' shown in FIG. 2A is the same as that of the power supply device 20 shown in FIG. 1A, except that the semiconductor device 26 is integrated on the printed circuit board and at least a portion of the semiconductor device 26 is disposed in the accommodating portion 24. Of course, it should be noted that those skilled in the art can select whether to provide the first through holes 27 and the second through holes 29 as shown in the drawing as needed.

For example, as described above, if the size of the semiconductor device 26 itself or the size of its pins is small, the structural arrangement shown in FIG. 2A of the present disclosure may be employed.

As shown in FIGS. 2B and 2C, the semiconductor device 26 includes a semiconductor power circuit 263 and/or semiconductor control circuits 261, 262. In one example, the semiconductor power circuit 263 includes one or more of diodes, MOSFETs, GaN FETs, and IGBTs, and the semiconductor control circuits 261, 262 includes a control chip 261 and a peripheral circuit 262 associated thereto.

In an embodiment, at least a portion or all of the semiconductor power circuit 263 may be accommodated in the accommodating portion 24. For example, the semiconductor control circuits 261, 262 may be disposed at any suitable positions on the mainboard 10 which do not correspond to the position of the power supply device 20.

In some embodiments, for example, the second pins 25 of the semiconductor device 26 are smaller in size and have a smaller tolerance than the first pins 21 of the magnetic device 22. During a reflow soldering process, the second pins 25 may shift from the soldering pads thereof as the magnetic device 22 shifts. Furthermore, it is also necessary to ensure or maintain that the second pins 25 of the semiconductor device 26 have the same flatness as the first pins 21 of the magnetic device 22. In addition, if a plurality of the semiconductor devices 26 and corresponding peripheral circuits are provided, it is also very difficult to simultaneously ensure a flatness between the plurality of semiconductor devices 26 and the magnetic device 22. Therefore, in order to ensure flatness and mounting tolerance between the magnetic device 22 (for example, the first pins 21 thereof) and the semiconductor device 22 (for example, the second pins 25 thereof) to obtain a higher reflow soldering quality, the structural configurations shown in FIGS. 2B and 2C of the present disclosure may be adopted, the semiconductor device 26 is mounted on a small printed circuit board to reduce leading connections of the pins, and then soldering pads are used to replace the leading connections of the small pins. In this way, the soldering pads can withstand a relatively large mounting tolerance while it is relatively easy to maintain the flatness between the printed circuit board and the magnetic device 22 to be consistent. It should be noted that the printed circuit board herein is only a printed circuit board for mounting the semiconductor device 26, but it is different from the printed circuit board device described later.

Specifically, in the example shown in FIGS. 2A and 2B, the semiconductor power circuit 263 and the semiconductor control circuits 261, 262 are integrated on the printed circuit board 31, and they are at least partially accommodated in the accommodating portion 24. Of course, the arrangements of the semiconductor power circuit 263 and the semiconductor control circuits 261, 262 are not limited to those shown in the drawings, and they may be selected and set by those skilled in the art as needed.

As shown in FIG. 2C, the semiconductor power circuit 263 and the semiconductor control circuits 261, 262 disposed on the printed circuit board 31 are electrically connected to the mainboard 10 through the soldering pads 32 provided on the other surface of the printed circuit board 31.

It should be noted that the path of heat dissipation in this example is the same as that shown in FIG. 1A, referring to the arrows in the drawing for detail, and it will not be described in detail herein.

Figure 3:
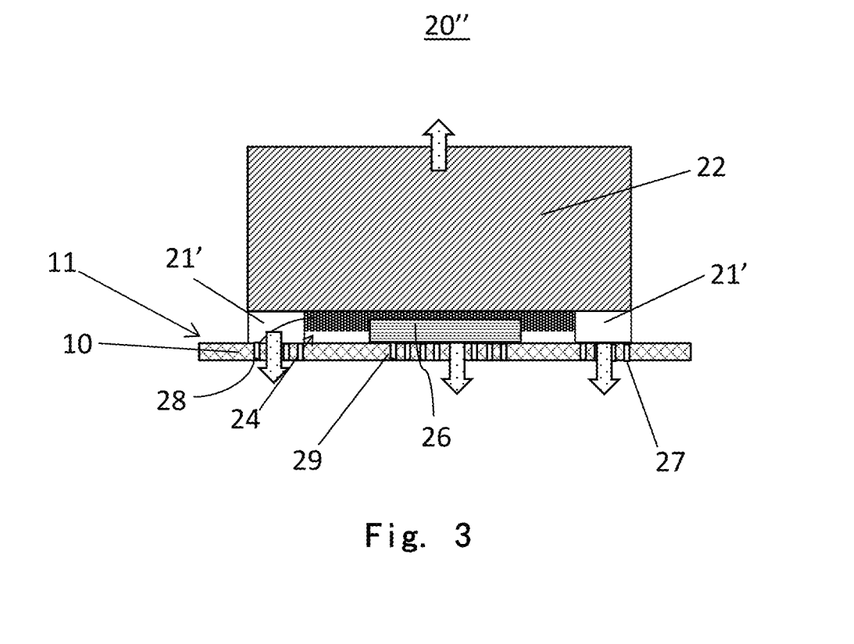
FIG. 3 is a schematic cross-sectional view of a power supply device mounted on a mainboard according to a further embodiment of the present disclosure.

FIG. 3 is a schematic structural view of a power supply device 20" mounted on a mainboard 10 according to a further embodiment of the present disclosure. The power supply device 20" differs from the power supply device 20 shown in FIG. 1A in that the accommodation portion 24 is formed on the bottom surface of the magnetic device 22 by setting a thickness of first pins 21', rather than providing a groove in the bottom surface. In this way, the semiconductor device 26 is at least partially accommodated in the accommodating portion 24. The other structural configurations are the same as those of the power supply device 20, and therefore they will not be described again. It should be noted that the path of heat dissipation in this example is also the same as shown in FIG. 1A, referring to the arrows in the drawing for detail, and it will not be described in detail herein.

Figure 4:
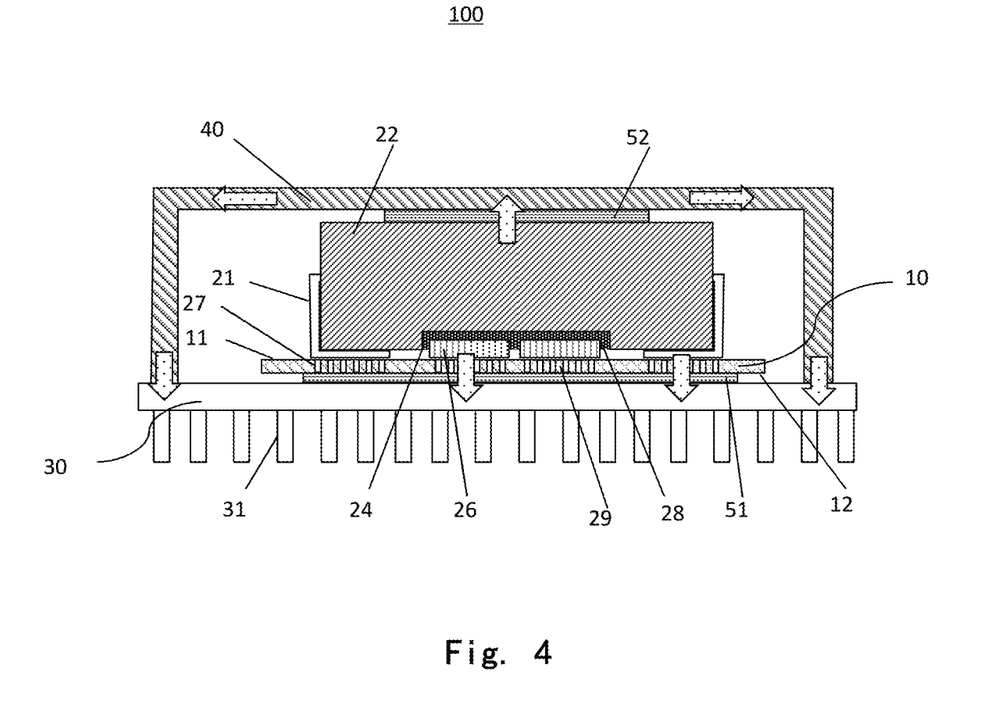
FIG. 4 is a schematic cross-sectional view of a printed circuit board device according to an embodiment of the present disclosure.

Referring to FIG. 4, it is a schematic cross-sectional view of a printed circuit board device 100 according to an embodiment of the present disclosure. The printed circuit board device 100 includes a mainboard 10 and a power supply device 20 cooperating with the mainboard 10. It should be noted that the power supply device 20 is put forward as an example for the purpose of illustration, but it is to be understood that the power supply device 20 may be replaced with the power supply devices 20', 20". Such explanation may also be applied to the structures shown in FIGS. 5 and 6.

Specifically, the printed circuit board device 100 further includes: a heat sink 30 located on a side of a second surface 12 of the mainboard 10 opposite to the first surface 11; and/or a cover 40 which is located at a side of the first surface 11 of the mainboard 10 and at least partially surrounds the mainboard 10 and the magnetic device 22. It should be understood that the heat sink 30 and the cover 40 may be selectively provided, that is, the heat sink 30 and the cover 40 may be simultaneously provided, or only one of them may be provided.

In this example, the case that the heat sink 30 and the cover 40 are simultaneously provided is taken as an example for description. The heat sink 30 includes a plurality of fins 31 spaced apart from each other. The cover 40 may be provided to completely surround the power supply device 20 and the mainboard 10, that is, the power supply device 20 and the mainboard 10 are completely accommodated in a space formed by the cover 40 and the heat sink 30. That is, both ends of the cover 40 are directly connected to the heat sink 30, respectively.

Further, the printed circuit board device 100 further includes: a second thermally conductive portion 51 located between the second surface 12 and the heat sink 30; and/or a third thermally conductive portion 52 located between the cover 40 and a surface of the magnetic device 22 facing away from the mainboard 10 (a top surface of the magnetic device 22). Similarly, either or both of the second thermally conductive portion 51 and the third thermally conductive portion 52 may be selectively provided by those skilled in the art as needed. The second thermally conductive portion 51 and the third thermally conductive portion 52 may be selected to be formed from a thermally conductive medium made of a thermal interface material (for example, LOCTITE ABLESTIK G500 or LOCTITE 5404), or any other suitable materials.

In such a structural configuration, the heat generated by the semiconductor device 26 has two paths of heat dissipation. One path of heat dissipation refers to that the heat generated by the semiconductor device 26 is transferred to the heat sink 30 through the mainboard 10 (for example, the mainboard 10 itself, the second through holes 29 thereon), the second thermally conductive portion 51, and is dissipated to the surrounding environment through the heat sink 30. The other path of heat dissipation refers to that the heat generated by the semiconductor device 26 is firstly transferred to the magnetic device 22 through the first thermally conductive portion 28, and successively transferred to the third thermally conductive portion 52 and the cover 40, and then dissipated to the external surrounding environment through the cover 40, as indicated by the arrows in the drawing.

In addition, it should be noted that the magnetic device 22 also has two paths of heat dissipation. One path of heat dissipation refers to that the heat generated by the magnetic device 22 is transferred to the first pins 21, the mainboard 10 (through the mainboard 10 itself and/or the first through holes 27) and the heat sink 30, and dissipated to the surrounding environment through the heat sink 30. The other path of heat dissipating refers to that the heat generated by the magnetic device 22 is transferred to the cover 40 through the third thermally conductive portion 52, and then dissipated to the external surrounding environment through the cover 40.

In one example, the printed circuit board device 100 shown in FIG. 4 has two paths of heat dissipation, thus even can withstand a temperature of more than 150 degrees Celsius, and it is advantageous for increasing power density.

Figure 5:
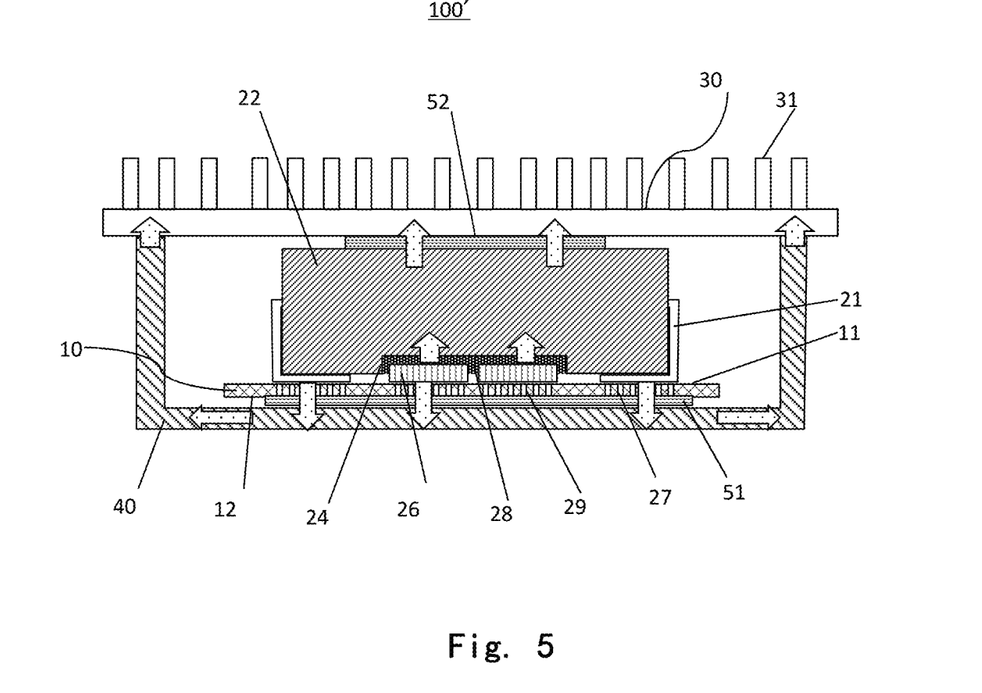
FIG. 5 is a schematic cross-sectional view of a printed circuit board device according to another embodiment of the present disclosure.

FIG. 5 is a schematic cross-sectional view of a printed circuit board device 100' according to another embodiment of the present disclosure. The printed circuit board device 100' has substantially similar structural configurations to those of the printed circuit board device 100 as described above, except for the positions of the heat sink 30 and the cover 40. That is, the heat sink 30 may be disposed at an upper side of the sheet of the drawing and the cover 40 may be disposed at a lower side of the sheet of the drawing, as needed.

Specifically, in addition to the mainboard 10 and the power supply device 20, 20', 20", the printed circuit board device 100' further includes: a heat sink 30 and/or a cover 40. The heat sink 30 is located above a surface of the magnetic device 22 facing away from the mainboard 10. The cover 40 is located at a side of a second surface 12 of the mainboard 10 and provided to at least partially surround the mainboard and the magnetic device 22.

In one example, the printed circuit board device 100' further includes a second thermally conductive portion 51 and/or a third thermally conductive portion 52. The second thermally conductive portion 51 is located between the cover 40 and the second surface 12 of the mainboard 10. The third thermally conductive portion 52 is located between the surface of the magnetic device 22 facing away from the mainboard 10 and the heat sink 30.

In addition, both ends of the cover 40 are also directly connected to the heat sink 30, respectively.

The printed circuit board device 100' is substantially similar to the printed circuit board device 100 in terms of operating principle, the path of heat dissipation is shown by the arrows in the drawing, and therefore it will not be described again.

Figure 6:
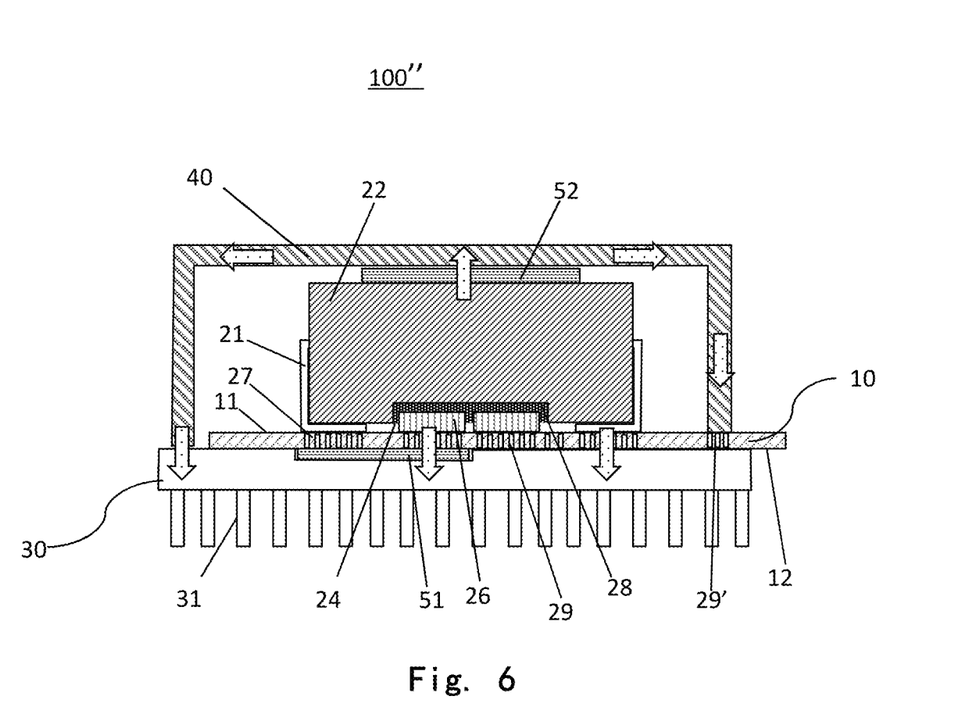
FIG. 6 is a schematic cross-sectional view of a printed circuit board device according to a further embodiment of the present disclosure.

FIG. 6 is a schematic cross-sectional view of a printed circuit board device 100" according to a further embodiment of the present disclosure. The printed circuit board device 100" has substantially similar structural configurations to those of the printed circuit board device 100, except that the cover 40 only surrounds a portion of the mainboard 10 but surrounds all of the power supply device 20; the second thermally conductive portion 51 is disposed at a position only corresponding to a portion of the magnetic device 22 and the semiconductor device 26. If the rest is consistent with an electrical network of the heat sink 30, it may be directly connected to the heat sink 30. It should be noted that the specific connection relationship of the heat sink, the mainboard and the cover may be determined as needed, that is, any two of them may be at least partially and directly connected to each other. For example, at least a portion of the cover 40 and/or at least a portion of the heat sink 30 are/is directly connected to a surface of the mainboard 10.

Specifically, the left end of the cover 40 is directly connected to the heat sink 30, and the right end of the cover 40 is directly connected to the mainboard 10. Third through holes 29' are provided at a junction of the mainboard 10 and the right end of the cover 40, and the through holes 29' function similarly to the first through holes 27 and the second through holes 29 for facilitating heat dissipation.

In addition, as shown in FIG. 6, the second thermally conductive portion 51 is embedded into the main body of the heat sink 30 (for example, it is formed by filling a heat conductive silicone resin or any other heat conductive mediums into a groove formed in the main body of the heat sink 30), and it is arranged in correspondence to the first through holes 27 and the second through holes 29 on the left side of the mainboard 10. That is, those skilled in the art may specifically determine whether to provide the second thermally conductive portion 51 and the third thermally conductive portion 52 and their specific arrangement positions and manners according to actual heat dissipation requirements and the like.

The printed circuit board device 100" is substantially similar to the printed circuit board device 100 in terms of operating principle, the path of heat dissipation is shown by the arrows in the drawing, and therefore it will not be described again.

The power supply devices or the printed circuit board devices according to the various embodiments of the present disclosure have at least one of the following advantages: the size of the power supply devices or the printed circuit board devices is reduced as compared with the conventional design, because the semiconductor device is at least partially accommodated in the accommodating portion in the magnetic device; with the design concept of the present disclosure, the structural design of the magnetic device or the semiconductor device may be not changed or adjusted, and the existing magnetic device or semiconductor device can be adopted; no additional package processing is required, since there is no direct electrical connection between the magnetic device and the semiconductor device, it does not require any soldering leads or substrates for connecting them, thereby reducing complexity and the problems such as electric leakage, interference, and poor stability due to the soldering leads; since the semiconductor device and the magnetic device each have two paths of heat dissipation, in particular, the magnetic device may be used as a heat dissipating device for the semiconductor device, it is advantageous to dissipate heat from the semiconductor device.

The above embodiments are merely illustrative of the principles and constructions of the present disclosure, but not intended to limit the present disclosure. It should be understood by those skilled in the art that any changes or improvements may be made to the present disclosure without departing from the general concept of the present disclosure, and such changes and improvements fall within the scope of the present disclosure. The scope of the present disclosure should be determined by the pending claims of the present application.

What is claimed is:

1. A power supply device mounted on a mainboard, the mainboard comprising a first surface, the power supply device comprising:
   a magnetic device located above the first surface of the mainboard and electrically connected to the mainboard;

at least one accommodating portion located on a surface of the magnetic device facing towards the first surface, each of the at least one accommodating portion of the power supply device being a cavity which is recessed inwardly from the surface of the magnetic device facing towards the first surface of the mainboard;

a semiconductor device which is at least partially accommodated in the at least one accommodating portion and electrically connected to the mainboard; and a first thermally conductive portion located in the at least one accommodating portion, and the semiconductor device is thermally coupled with the magnetic device by the first thermally conductive portion.

2. The power supply device according to claim 1, wherein the magnetic device further comprises at least one first pin configured to be electrically connected to the mainboard, and the semiconductor device further comprises at least one second pin configured to be electrically connected to the mainboard.

3. The power supply device according to claim 1, wherein the magnetic device comprises an inductor and/or a transformer, and the semiconductor device comprises a semiconductor power circuit and/or a semiconductor control circuit.

4. The power supply device according to claim 3, wherein at least a portion of the semiconductor power circuit is accommodated in the at least one accommodating portion.

5. The power supply device according to claim 3, wherein the semiconductor power circuit and/or the semiconductor control circuit are/is integrated on a printed circuit board, and are/is at least partially accommodated in the at least one accommodating portion, and the printed circuit board is electrically connected to the mainboard.

6. The power supply device according to claim 4, wherein the semiconductor power circuit comprises one or more of diodes, MOSFETS, GaN FETs, and IGBTs, and the semiconductor control circuit comprises a control chip and a peripheral circuit associated thereto.

7. A printed circuit board device, comprising:
a mainboard comprising a first surface; and
a power supply device cooperating with the mainboard, the power supply device comprising:
  a magnetic device located above the first surface of the mainboard and electrically connected to the mainboard;
  at least one accommodating portion located on a surface of the magnetic device facing towards the first surface, each of the at least one accommodating portion of the power supply device being a cavity which is recessed inwardly from the surface of the magnetic device facing towards the first surface of the mainboard; and
  a semiconductor device which is at least partially accommodated in the at least one accommodating portion and electrically connected to the mainboard; and
  a first thermally conductive portion located in the at least one accommodating portion, and the semiconductor device is thermally coupled with the magnetic device by the first thermally conductive portion.

8. The printed circuit board device according to claim 7, wherein the printed circuit board device further comprises:
a heat sink located on a side of a second surface of the mainboard opposite to the first surface; and/or
a cover which is located at a side of the first surface of the mainboard and configured to at least partially surround the mainboard and the magnetic device.

9. The printed circuit board device according to claim 8, wherein the printed circuit board device further comprises:
a second thermally conductive portion located between the second surface and the heat sink; and/or
a third thermally conductive portion located between the cover and a surface of the magnetic device facing away from the mainboard.

10. The printed circuit board device according to claim 8, wherein:
at least a portion of the cover is directly connected to the heat sink; and/or
at least a portion of the cover and/or at least a portion of the heat sink are/is directly connected to a surface of the mainboard.

11. The printed circuit board device according to claim 7, wherein the printed circuit board device further comprises:
a heat sink located above a surface of the magnetic device facing away from the mainboard; and/or
a cover which is located at a side of a second surface of the mainboard and configured to at least partially surround the mainboard and the magnetic device.

12. The printed circuit board device according to claim 11, wherein the printed circuit board device further comprises:
a second thermally conductive portion located between the cover and the second surface of the mainboard; and/or
a third thermally conductive portion located between the surface of the magnetic device facing away from the mainboard and the heat sink.

13. The printed circuit board device according to claim 7, wherein the magnetic device of the power supply device comprises an inductor and/or a transformer, and the semiconductor device of the power supply device comprises a semiconductor power circuit and/or a semiconductor control circuit; and
at least a portion of the semiconductor power circuit is accommodated in the at least one accommodating portion.

14. The printed circuit board device according to claim 7, wherein the magnetic device of the power supply device comprises an inductor and/or a transformer, and the semiconductor device of the power supply device comprises a semiconductor power circuit and/or a semiconductor control circuit; and
at least a portion of the semiconductor power circuit is accommodated in the at least one accommodating portion.

* * * * *